United States Patent
Hade et al.

(10) Patent No.: US 11,662,382 B1
(45) Date of Patent: May 30, 2023

(54) METHOD AND APPARATUS FOR CONTEMPORARY TEST TIME REDUCTION FOR JTAG

(71) Applicant: Marvell Asia Pte, Ltd., Singapore (SG)

(72) Inventors: Umesh Prabhakar Hade, Buldhana (IN); Balaji Upputuri, Ongole (IN)

(73) Assignee: Marvell Asia Pte, Ltd., Singapore (SG)

( * ) Notice: Subject to any disclaimer, the term of this patent is extended or adjusted under 35 U.S.C. 154(b) by 63 days.

(21) Appl. No.: 17/483,488

(22) Filed: Sep. 23, 2021

Related U.S. Application Data

(60) Provisional application No. 63/082,122, filed on Sep. 23, 2020.

(51) Int. Cl.
| | |
|---|---|
| *G01R 31/3177* | (2006.01) |
| *G01R 31/3185* | (2006.01) |
| *G06F 9/30* | (2018.01) |
| *G06F 1/10* | (2006.01) |

(52) U.S. Cl.
CPC . *G01R 31/3177* (2013.01); *G01R 31/318533* (2013.01); *G01R 31/318536* (2013.01); *G06F 1/10* (2013.01); *G06F 9/30134* (2013.01)

(58) Field of Classification Search
CPC ........ G01R 31/3177; G01R 31/318533; G01R 31/318536; G06F 1/10; G06F 9/30134
USPC ................. 714/726, 727, 729, 731
See application file for complete search history.

(56) References Cited

U.S. PATENT DOCUMENTS

| | | | | |
|---|---|---|---|---|
| 6,304,979 | B1* | 10/2001 | Bacigalupo | G06F 1/10 |
| | | | | 713/601 |
| 6,525,973 | B1* | 2/2003 | Shokouhi | G11C 29/12 |
| | | | | 365/189.11 |
| 6,804,802 | B1 | 10/2004 | Lulla et al. | |
| 7,284,174 | B2 | 10/2007 | Dubey | |
| 8,136,003 | B2* | 3/2012 | Swoboda | G01R 31/318572 |
| | | | | 714/30 |
| 2010/0017666 | A1* | 1/2010 | Otake | G01R 31/318544 |
| | | | | 714/E11.155 |

* cited by examiner

*Primary Examiner* — John J Tabone, Jr.

(57) ABSTRACT

A method of loading a data string into a Joint Test Action Group (JTAG) shift register is provided. The method includes determining whether the last bit of the data string is equal to one or zero. In response to determining that the last bit is equal to one, the method includes simultaneously setting each flip-flop of the shift register to one, identifying first data string loading bits by removing, from the data string, the last bit and any other bits in a continuous sequence of bits, including the last bit, that are each equal to one, and sequentially loading the identified first data string loading bits into the shift register. A testing apparatus for performing the method and an enhanced JTAG interface are also provided. The method, testing apparatus, and enchanced JTAG interface may reduce the number of clock cycles required to load the shift register.

20 Claims, 3 Drawing Sheets

METHOD AND APPARATUS FOR CONTEMPORARY TEST TIME REDUCTION FOR JTAG

CROSS REFERENCE TO RELATED APPLICATION

This disclosure claims the benefit of commonly-assigned U.S. Provisional Patent Application No. 63/082,122, filed Sep. 23, 2020, which is hereby incorporated by reference herein in its entirety.

FIELD OF USE

This disclosure relates to boundary-scan test architectures and methods. More particularly, this disclosure relates an enhanced boundary-scan test architecture that provides at least one additional input pin for reducing the number of clock cycles required to load an instruction into a shift register during a boundary scan test.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Boundary-scan testing may be used to test interconnects between integrated circuits (ICs) mounted on a printed circuit board (PCB) of a device without requiring physical test probes. Boundary-scan cells may be created using multiplexer and latch circuits that are attached to each pin of the device. The boundary scan cells may capture data from pin or core logic signals, as well as force data onto pins. Captured data may be serially shifted through an access port and compared to an expected value to verify functionality of the device. Such testing may be conducted according to the IEEE JTAG 1149.1 standard ("JTAG standard"), which provides a protocol for accomplishing various test functions.

Boundary-scan testing pins are "exposed"—i.e., made available as package pins for performing a JTAG scan. Under the JTAG standard, five pins are required—test clock (TCK), test control line (TMS), test data-in (TDI), test data-out (TDO), and test reset (TRST). The JTAG standard outlines the details of a serial path linked to a path of linked registers (e.g., boundary scan registers) through each integrated circuit and properties of a control circuit that controls the transfer of data through the shift registers. During a JTAG scan, an instruction (e.g., operational code) is serially loaded into a shift register (e.g., of an instruction register or data register) of the boundary-scan architecture. However, because only one bit of data may be added to a shift register per clock cycle (e.g., TCK cycle) under the JTAG standard, a significant number of TCK cycles may be required to complete a JTAG scan.

SUMMARY

Boundary-scan test architectures and methods, according to implementations of this disclosure, that provide at least one additional input pin for reducing the number of clock cycles required to load an instruction into a shift register during a boundary scan test, are provided. In a first implementation, a method of loading a data string into a JTAG shift register is provided. The method includes determining whether a value of the last bit of the data string is equal to one or zero, and in response to determining that the value of the last bit of the data string is equal to one, simultaneously setting each flip-flop of the shift register to one; identifying first data string loading bits by removing, from the data string, the last bit and any other bits in a continuous sequence of bits, including the last bit, that are each equal to one, and sequentially loading the identified first data string loading bits into the shift register.

In one embodiment of the first implementation, the method may further include, in response to determining that the value of the last bit of the data string is equal to zero, simultaneously resetting each flip-flop of the shift register to zero, identifying second data string loading bits by removing, from the data string, the last bit and any other bits in a continuous sequence of bits, including the last bit, that are each equal to zero, and sequentially loading the identified second data string loading bits into the shift register.

In one embodiment of the first implementation, the data string may be a JTAG instruction and the JTAG shift register may be a JTAG instruction register (IR).

In one embodiment of the first implementation, sequentially loading the identified first data string loading bits into the JTAG IR may include setting the JTAG IR to a Shift-IR state, and loading, while the JTAG IR is set to the Shift-IR state, one bit of the identified first data string each clock cycle until all of the identified first data string loading bits have been shifted into the JTAG IR.

In one embodiment of the first implementation, sequentially loading the identified second data string loading bits into the JTAG IR may include setting the JTAG IR to a shift-IR state, and loading, while the JTAG IR is set to the shift-IR state, one bit of the identified second data string each clock cycle until all of the identified second data string loading bits have been shifted into the JTAG IR.

In one embodiment of the first implementation, the JTAG shift register may be a JTAG data register (DR). Sequentially loading the identified first data string loading bits into the JTAG DR may include setting the JTAG DR to a shift-DR state, and loading, while the JTAG DR is set to the shift-DR state, one bit of the identified first data string each clock cycle until all of the identified first data string loading bits have been shifted into the JTAG DR. Sequentially loading the identified second data string loading bits into the JTAG DR may include setting the JTAG DR to a Shift-DR state, and loading, while the JTAG DR is set to the Shift-DR state, one bit of the identified second data string each clock cycle until all of the identified second data string loading bits have been shifted into the JTAG DR.

In a second implementation, a testing apparatus for loading a data string into a JTAG shift register of boundary scan architecture of an integrated circuit (IC) device is provided. The testing apparatus includes a test interface that couples to a test access port of the IC device, and control circuitry configured to apply, via the test interface, a first sequence to a first pin of the IC device, the first sequence setting the shift register to a shift state, and determine whether a value of the last bit of the data string is equal to one or zero. In response to determining that the value of the last bit of the data string is equal to one, the control circuitry is further configured to apply, via the test interface, a set signal to a second pin of the IC device, the set signal simultaneously setting each flip-flop of the shift register to one, identify first data string loading bits by removing, from the data string, the last bit and any other bits in a continuous sequence of bits, including the last bit, that are each equal to one, and apply, via the test interface, a first load signal to a third pin of the IC device, the first load signal sequentially loading the identified first data string loading bits into the shift register.

In one embodiment of the second implementation, the control circuitry may be further configured, in response to determining that the value of the last bit of the data string is equal to zero, to apply, via the test interface, a reset signal to a fourth pin of the IC device, the reset signal simultaneously resetting each flip-flop of the shift register to zero, identify second data string loading bits by removing, from the data string, the last bit and any other bits in a continuous sequence of bits, including the last bit, that are each equal to zero; and apply, via the test interface, a second load signal to the third pin of the IC device, the second load signal sequentially loading the identified second data string loading bits into the shift register.

In one embodiment of the second implementation, the testing apparatus may be a JTAG testing apparatus, and the data string may be a JTAG instruction.

In one embodiment of the second implementation, the JTAG shift register may be a JTAG instruction register (IR), and the shift state may be a shift IR state.

In one embodiment of the second implementation, the control circuitry may be further configured, when applying the first load signal to the third pin, to apply, via the test interface, the first load signal until all of the identified first data string loading bits have been sequentially shifted into the JTAG IR over a number of clock cycles corresponding to the number of first data string loading bits.

In one embodiment of the second implementation, the control circuitry is further configured, when applying the second load signal to the third pin, to apply, via the test interface, the second load signal until all of the identified second data string loading bits have been sequentially shifted into the JTAG IR over a number of clock cycles corresponding to the number of second data string loading bits.

In one embodiment of the second implementation, the JTAG shift register may be a JTAG data register (DR), and the shift state may be a shift DR state.

In one embodiment of the second implementation, the control circuitry may be further configured, when applying the first load signal to the third pin, to apply, via the test interface, the first load signal until all of the identified first data string loading bits have been sequentially shifted into the JTAG DR over a number of clock cycles corresponding to the number of first data string loading bits.

In one embodiment of the second implementation, the control circuitry may be further configured, when applying the second load signal to the third pin, to apply, via the test interface, the second load signal until all of the identified second data string loading bits have been sequentially shifted into the JTAG DR over a number of clock cycles corresponding to the number of second data string loading bits.

In one embodiment of the second implementation, the JTAG DR is one of a bypass register and a boundary scan register.

In one embodiment of the second implementation, the first pin may be a Test Mode Select (TMS) pin, the second pin may be a shift register set (SRS) pin, the third pin may be a Test Data-In (TDI) pin, and the fourth pin may be a shift register reset (SRR pin).

In a third implementation, an enhanced JTAG interface is provided. The enhanced JTAG interface includes a first pin configured to receive a Test Clock (TCK) signal, a second pin configured to receive a Test Mode Select (TMS) signal, a third pin configured to receive a Test Data-In (TDI) signal, a fourth pin configured to receive shift register set (SRS) signal, the SRS signal being configured to simultaneously set each flip flop of a shift register equal to one, and a fifth pin configured to receive a shift register reset (SRR) signal, the SRR signal being configured to simultaneously set each flip flop of a shift register equal to zero.

In one embodiment of the third implementation, the enhanced JTAG interface may further include a sixth pin configured to output a Test Data-Out (TDO) signal, and a seventh pin configured to receive a Test Reset (TRST) signal.

In one embodiment of the third implementation, the JTAG interface may be configured to connect a JTAG testing apparatus to boundary scan architecture of an integrated circuit (IC) device.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

As noted above, according to the JTAG standard, the number of TCK cycles required to load an instruction (e.g., data string) into a shift register (e.g., a single bit shift register) corresponds to the width (e.g., number of bits) of the shift register. For example, according to the JTAG standard, to load an instruction into a shift register (e.g., of a data register or an instruction register), the shift register is set to a shift state and the bits of the instruction are sequentially loaded into the shift register over a number of clock cycles equal to the number of bits of the shift register. That is, according to the JTAG standard, the same number of clock cycles are required to load any instruction into a shift register, regardless of the values of bits of the instruction.

Implementations of the subject matter of this disclosure allow the number of clock cycles required to load an instruction into a shift register to be reduced. For example, in accordance with implementations of this disclosure, the JTAG interface may be provided with a first additional pin to simultaneously set each bit of a shift register equal to one and a second additional pin to simultaneously set each bit of the shift register equal to zero. By preloading the shift register with all ones or all zeros based on the last bit of the instruction to be loaded into the shift register, the number of TCK cycles required to load the data into the shift register may be reduced.

Implementations of the subject matter of this disclosure may be illustrated with reference to FIGS. 1-4.

Figure 1:
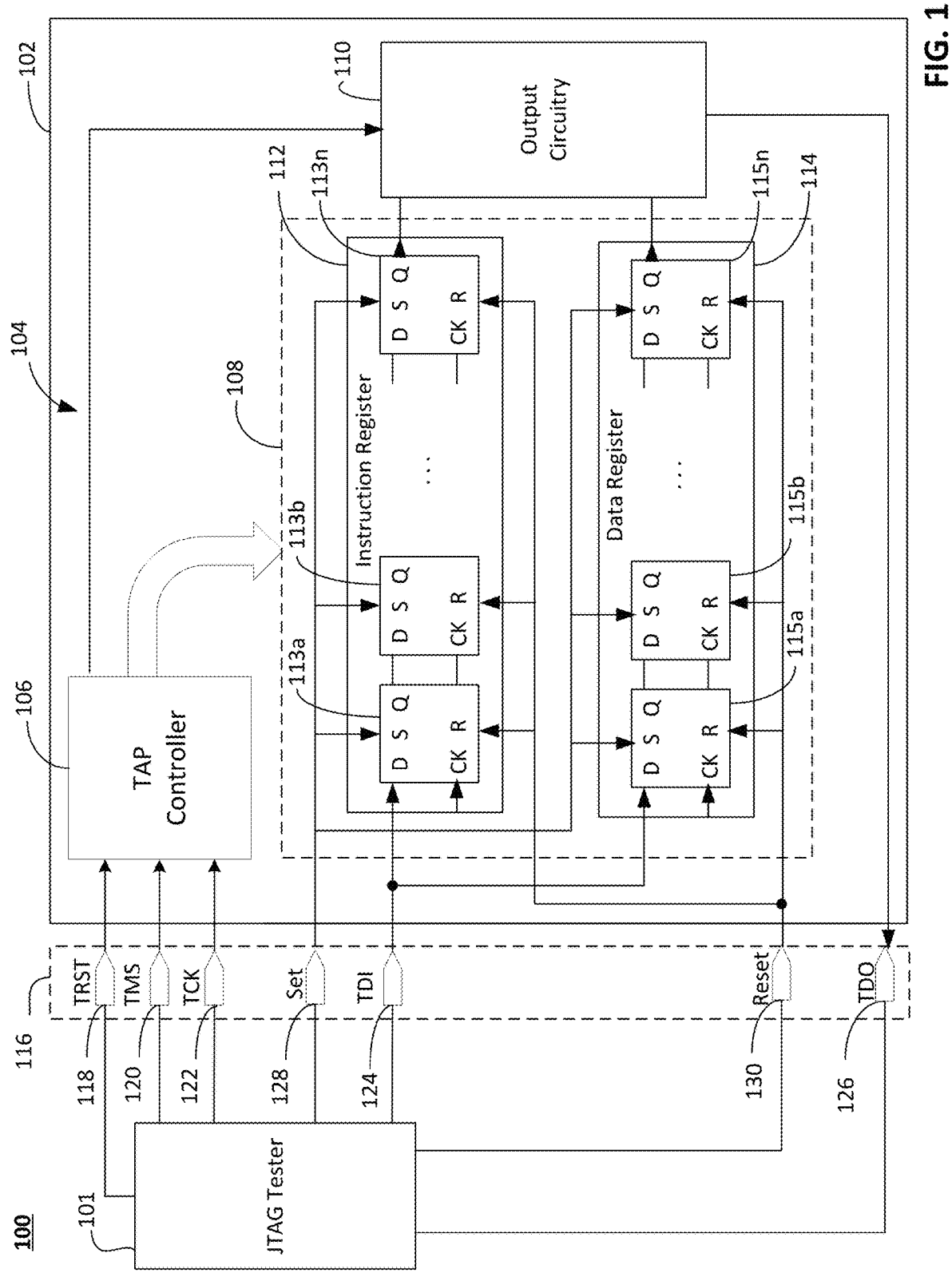
FIG. 1 is a schematic representation of a system for performing boundary-scan testing, in accordance with some embodiments of the present disclosure.

FIG. 1 is a schematic representation of a system 100 for performing boundary-scan testing, in accordance with some embodiments of the present disclosure. As shown, the system 100 includes a device 102 having boundary-scan architecture 104 and a test access port (TAP) 116, which is an interface between the boundary scan architecture 104 and output pins configured to be connected to a JTAG tester 101. The JTAG tester 101 may include control circuitry configured to perform the processes described herein. For clarity, only certain portions of the boundary scan architecture 104 are illustrated. However, it should be understood that the boundary scan architecture 104 may include the other portions of the boundary scan architecture described by the JTAG standard, which is hereby incorporated by reference in its entirety.

As shown, the TAP 116 includes the five test pins specified by the JTAG standard (i.e., TRST pin 118, TMS pin 120, TCK pin 122, TDI pin 124, and TDO pin 126). In some embodiments, the TRST pin 118 may be omitted in accordance with the JTAG standard (e.g., in which case the functionality of the TRST pin 118 may be provided by the TMS pin 120). Additionally, the TAP 116 includes two additional test pins not specified by the JTAG standard (i.e., set pin 128 (e.g., shift register set pin) and reset pin 130 (e.g., shift register reset pin)). In some embodiments, as described in greater detail with reference to FIGS. 3 and 4, the TAP 116 may include one of the set pin 128 and the reset pin 130. In some embodiments, the test pins may be multiplexed with run-time functional signals, so that during normal operation, the pins may be used for run-time functional signals. In this case, applying a signal to a test control pin initiates a test mode that changes certain pins to boundary scan testing pins for performing a JTAG scan.

As shown, the boundary scan architecture 104 includes a TAP controller 106, a register bank 108 including an instruction register 112 and a data register 114, and output circuitry 110. Although only a single data register 114 is shown, it should be understood that the boundary scan architecture 104 includes a plurality of data registers described by the JTAG standard, including a bypass register, a boundary scan register, etc. As shown, the instruction register 112 may include a plurality of cascaded flip-flops (113a, 113b, . . . 113n). Similarly, the data register 114 may include a plurality of cascaded flip-flops (115a, 115b, . . . 115n). Each of the flip-flops may correspond to a bit of the corresponding register. Although only three cascaded flip-flops are shown, it should be understood that each of the instruction register 112 and the data register 114 may include any number of flip flops (e.g., 4, 16, 32).

The TAP controller 106 is a synchronous finite state machine that changes states in response to signals input on the TRST pin 118, the TMS pin 120, and TCK pin 122, and controls a sequence of operations of the boundary scan architecture 104. The TAP controller 106 is controlled by instructions (e.g., operational codes—"opcodes") loaded into the instruction register 112. For example, in accordance with the JTAG standard, the instructions loaded into the instruction register 112 are decoded (e.g., by an instruction decoder) to determine the operations and functions of the data registers (i.e., represented by the data register 114). The opcodes may be standard instructions defined by the JTAG standard or user-defined to perform different operations. In accordance with the JTAG standard, only one of the registers of the register bank 108 may form a serial path from the TDI pin 124 to the TDO pin 126 at a time, through the output circuitry 110, under the control of the TAP controller 106. A process of loading an instruction into a shift register (e.g., the instruction register 112) will now be described with reference to FIG. 2.

Figure 2:
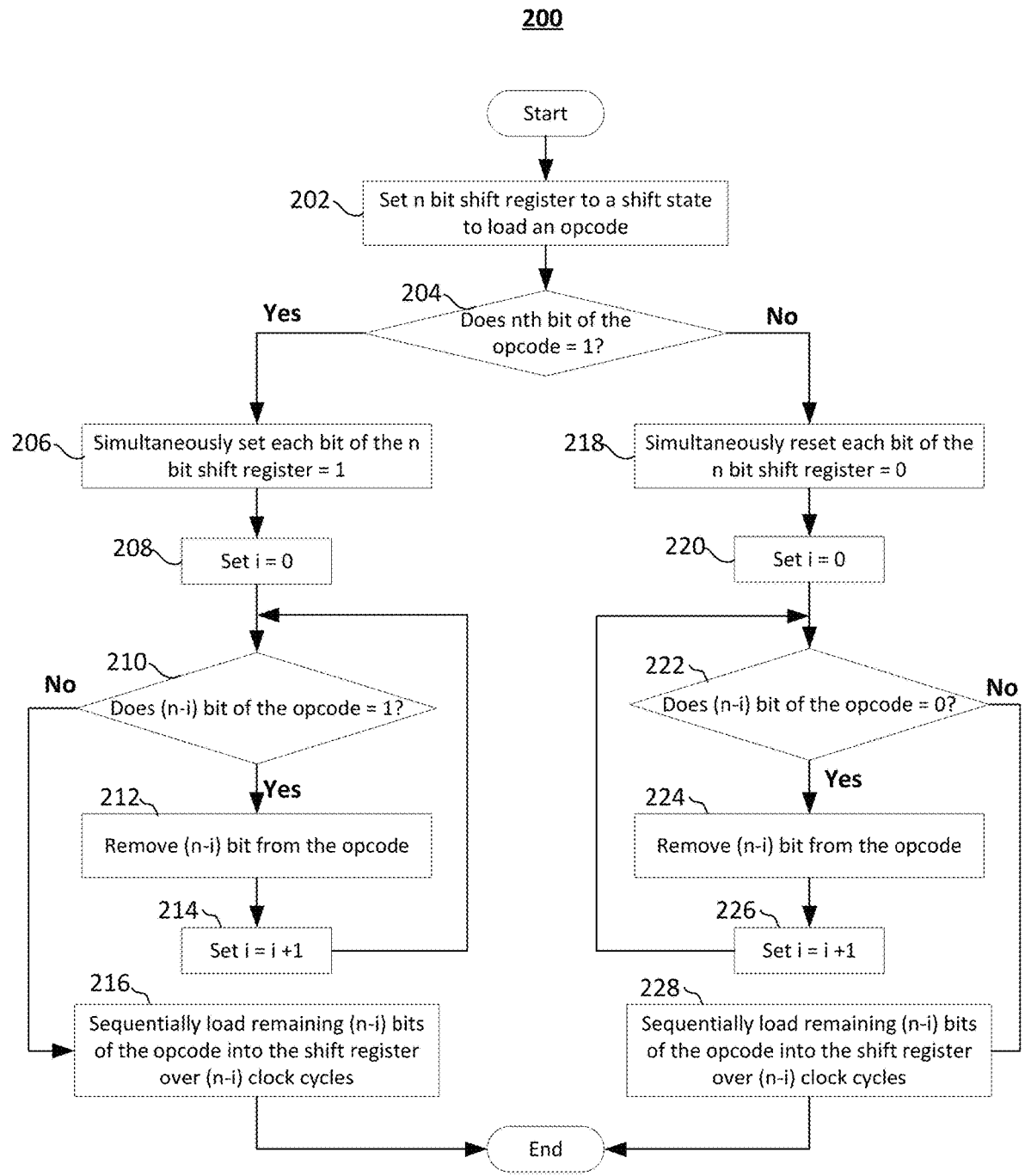
FIG. 2 depicts a flowchart of illustrative steps of a process for loading a data string (e.g., an opcode) into an n bit shift register, in accordance with some embodiments of the present disclosure.

FIG. 2 depicts a flowchart of illustrative steps of a process 200 for loading a data string into an n bit shift register, in accordance with some embodiments of the present disclosure. The data string may be an instruction such as an operational code ("opcode") that specifies an operation to be performed. The process 200 begins at 202 when the JTAG tester 101 sets an n bit shift register to a shift state to load an opcode. For example, if the opcode is to be loaded into the instruction register 112, the JTAG tester 101 applies a first predetermined sequence to the TMS pin 120 (e.g., a first pin) that causes the TAP controller 106 to set the instruction register 112 to a Shift IR state. If the opcode is to be loaded into the data register 114, the JTAG tester 101 applies a second predetermined sequence to the TMS pin 120 that causes the TAP controller 106 to set the data register 114 into a Shift DR state. For example, in accordance with the JTAG standard, the TAP controller 106 may transition each of the instruction register 112 and the data register 114 between a plurality of states (e.g., Select, Capture, Shift, Exit, Pause, Update).

At 204, the JTAG tester 101 determines if the $n^{th}$ bit (i.e., the last bit or least significant bit) of the opcode is equal to one. In response to determining that the $n^{th}$ bit is equal to one ("Yes" at 204), the process 200 proceeds to 206. Otherwise ("No" at 204), the process 200 proceeds to 218.

At 206, in response to determining that the $n^{th}$ bit is equal to one, the JTAG tester 101 simultaneously sets each bit of the n bit shift register to one. For example, the JTAG tester 101 applies a pulse to the set pin 128 (e.g., a second pin).

At 208-214, if the opcode ends with a continuous sequence of bits equal to one (i.e., including the $n^{th}$ bit), the JTAG tester 101 removes the continuous sequence of bits from the opcode. For example, at 208, the JTAG tester 101 sets a counter equal to zero (i=0). At 210, the JTAG tester 101 determines if the (n-i) bit of the opcode is equal to one. In response to determining that the (n-i) bit is equal to one ("Yes" at 210) the process 200 proceeds to 212. Otherwise ("No" at 210), the process 200 proceeds to 216. At 212, in response to determining that the (n-i) bit of the opcode is equal to one, the JTAG tester 101 removes the (n-i) bit from the opcode. At 214, the JTAG tester 101 increments the counter (i=i+1) and returns to 210. The JTAG tester 101 repeats 210-214 until any continuous sequence of bits, including the last bit, that are equal to one, are removed from the opcode. For example, if the opcode is 0011 (e.g., a PRELOAD instruction), the JTAG tester 101 removes the last two bits. If the opcode is equal to 0101, the JTAG tester 101, removes only the last bit. If the opcode is equal to 1111 (e.g., a BYPASS instruction), the JTAG tester removes all of the bits from the opcode.

At 216, the JTAG tester 101 sequentially loads any remaining (n-i) bits of the opcode into the shift register over (n-i) clock cycles. For example, at each clock cycle (TCK), the JTAG tester 101 sequentially loads the remaining (n-i) bits of the opcode through the TDI pin 124 (e.g., a third pin).

Returning to 218, in response to determining that the $n^{th}$ bit is not equal to one (i.e., equal to zero), the JTAG tester 101 simultaneously resets each bit of the n bit shift register to zero. For example, the JTAG tester 101 applies a pulse to the reset pin 130 (e.g., a fourth pin).

At 220-226, if the opcode ends with a continuous sequence of bits equal to zero (i.e., including the $n^{th}$ bit), the JTAG tester 101 removes the continuous sequence of bits from the opcode. For example, at 220, the JTAG tester 101 sets a counter equal to zero (i=0). At 222, the JTAG tester 101 determines if the (n-i) bit of the opcode is equal to zero. In response to determining that the (n-i) bit is equal to zero ("Yes" at 222), the process 200 proceeds to 224. Otherwise ("No" at 222), the process 200 proceeds to 228. At 224, in response to determining that the (n-i) bit of the opcode is equal to zero, the JTAG tester 101 removes the (n-i) bit from the opcode. At 226, the JTAG tester 101 increments the counter (i=i+1) and returns to 2220. The JTAG tester 101 repeats 222-226 until any continuous sequence of bits, including the last bit, that are equal to zero, are removed from the opcode. For example, if the opcode is equal to 0100 (e.g., a user defined instruction), the JTAG tester 101 removes the last two bits. If the opcode is equal to 0010 (e.g., a SAMPLE instruction), the JTAG tester 101, removes only the last bit. If the opcode is equal to 0000 (e.g., an EXTEST instruction), the JTAG tester 101 removes all of the bits from the opcode.

At 228, the JTAG tester 101 sequentially loads any remaining (n-i) bits of the opcode into the shift register over (n-i) clock cycles. For example, at each clock cycle (TCK), the JTAG tester 101 sequentially loads the remaining (n-i) bits of the opcode through the TDI pin 124.

Because the number of clock cycles (TCK) required to load an opcode into the shift register is reduced by the number of bits that are removed according to the process 200, the number of TCK cycles required to perform a JTAG operation is reduced, as shown below, e.g., in Table 1.

TABLE 1

| Instruction Description | Opcode | JTAG Standard (TCK Cycles) | Process of FIG. 2 (TCK Cycles) |
|---|---|---|---|
| EXTEST | 0000 | 4 | 0 |
| CLAMP | 0001 | 4 | 3 |
| SAMPLE | 0010 | 4 | 3 |
| PRELOAD | 0011 | 4 | 2 |
| User Defined | 0100 | 4 | 2 |
| User Defined | 0101 | 4 | 3 |
| User Defined | 0110 | 4 | 3 |
| User Defined | 0111 | 4 | 1 |
| User Defined | 1000 | 4 | 1 |
| User Defined | 1001 | 4 | 3 |
| . . . | . . . | . . . | . . . |
| BYPASS | 1111 | 4 | 0 |

In some embodiments, it may be advantageous to include only one of the additional pins (i.e., the set pin 128 or the reset pin 130), depending on the number of pins that are available on the device 102.

Figure 3:
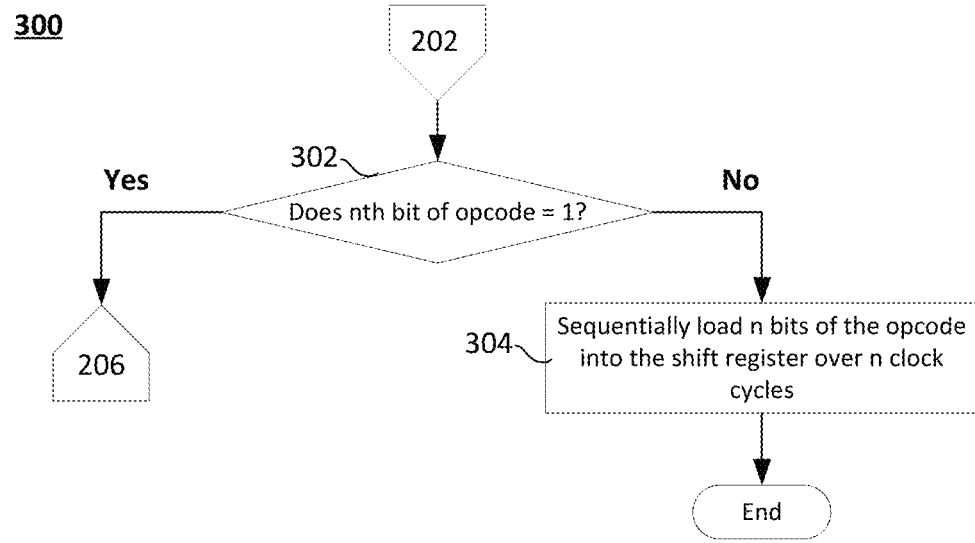
FIG. 3 depicts a flowchart of illustrative steps of a process for loading a data string (e.g., an opcode) into an n bit shift register, in accordance with some embodiments of the present disclosure.

FIG. 3 depicts a flowchart of illustrates steps of a process 300 for loading a data string (e.g., an opcode) into an n bit shift register when the system 100 of FIG. 1 only includes the set pin 128 (i.e., and does not include the rest pin 130), in accordance with some embodiments of the present disclosure. The process 300 is one implementation of a method of performing the process 200 and begins after step 202. At step 302, the JTAG tester 101 determines if the $n^{th}$ bit (i.e., the last bit) of the opcode is equal to one. In response to determining that the $n^{th}$ bit is equal to one ("Yes" at 302), the process 300 proceeds to 206, as described above with reference to FIG. 2. Otherwise ("No" at 302), the process 300 proceeds to 304

At 304, because the JTAG tester 101 is not able to simultaneously reset each bit of the n bit shift register to zero, the JTAG tester 101 sequentially loads the n bits of the opcode into the shift register over (n) clock cycles through the TDI pin 124.

Because the number of clock cycles (TCK) required to load an opcode into the shift register is still reduced for opcodes ending in one, the number of TCK cycles required to perform certain JTAG operations is still reduced, while using a fewer number of pins than the process 200 described with reference to FIG. 2.

Figure 4:
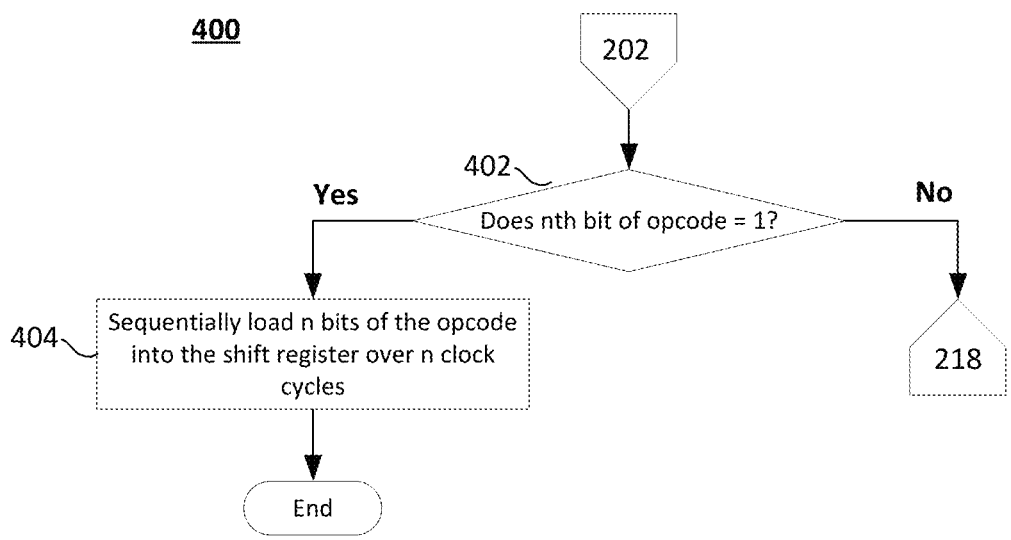
FIG. 4 depicts a flowchart of illustrative steps of a process for loading a data string (e.g., an opcode) into an n bit shift register, in accordance with some embodiments of the present disclosure.

FIG. 4 depicts a flowchart of illustrates steps of a process 400 for loading a data string (e.g., an opcode) into an n bit shift register when the system 100 of FIG. 1 only includes the reset pin 130 (i.e., and does not include the set pin 128), in accordance with some embodiments of the present disclosure. The process 400 is one implementation of a method of performing the process 200 and begins after step 202. At step 402, the JTAG tester 101 determines if the $n^{th}$ bit (i.e., the last bit) of the opcode is not equal to one (i.e., equal to zero). In response to determining that the $n^{th}$ bit is equal to not equal to one ("No" at 402), the process 400 proceeds to 218, as described above with reference to FIG. 2. Otherwise ("Yes" at 304), the process 400 proceeds to 404

At 404, because the JTAG tester 101 is not able to simultaneously set each bit of the n bit shift register to one, the JTAG tester 101 sequentially loads the n bits of the opcode into the shift register over (n) clock cycles through the TDI pin 124.

Because the number of clock cycles (TCK) required to load an opcode into the shift register is still reduced for opcodes ending in zero, the number of TCK cycles required to perform certain JTAG operations is still reduced, while using a fewer number of pins than the process 200 described with reference to FIG. 2.

Thus it is seen that a boundary scan test architecture and method implemented, and in which the number of TCK cycles required to perform JTAG operations are reduced.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method of loading a data string into a Joint Test Action Group (JTAG) shift register, the method comprising:
   determining whether a value of the last bit of the data string is equal to one or zero; and
   in response to determining that the value of the last bit of the data string is equal to one:
      simultaneously setting each flip-flop of the shift register to one;
      identifying first data string loading bits by removing, from the data string, the last bit and any other bits in a continuous sequence of bits, including the last bit, that are each equal to one; and
      sequentially loading the identified first data string loading bits into the shift register.

2. The method of claim 1, further comprising in response to determining that the value of the last bit of the data string is equal to zero:
   simultaneously resetting each flip-flop of the shift register to zero;

identifying second data string loading bits by removing, from the data string, the last bit and any other bits in a continuous sequence of bits, including the last bit, that are each equal to zero; and sequentially loading the identified second data string loading bits into the shift register.

3. The method of claim 2, wherein the data string is a JTAG instruction and the JTAG shift register is a JTAG instruction register (IR).

4. The method of claim 3, wherein sequentially loading the identified first data string loading bits into the JTAG IR comprises:

setting the JTAG IR to a Shift-IR state; and loading, while the JTAG IR is set to the Shift-IR state, one bit of the identified first data string each clock cycle until all of the identified first data string loading bits have been shifted into the JTAG IR.

5. The method of claim 3, wherein sequentially loading the identified second data string loading bits into the JTAG IR comprises:

setting the JTAG IR to a shift-IR state; and loading, while the JTAG IR is set to the shift-IR state, one bit of the identified second data string each clock cycle until all of the identified second data string loading bits have been shifted into the JTAG IR.

6. The method of claim 2, wherein the JTAG shift register is a JTAG data register (DR), wherein sequentially loading the identified first data string loading bits into the JTAG DR comprises:

setting the JTAG DR to a shift-DR state; and loading, while the JTAG DR is set to the shift-DR state, one bit of the identified first data string each clock cycle until all of the identified first data string loading bits have been shifted into the JTAG DR, and wherein sequentially loading the identified second data string loading bits into the JTAG DR comprises:

setting the JTAG DR to a Shift-DR state; and loading, while the JTAG DR is set to the Shift-DR state, one bit of the identified second data string each clock cycle until all of the identified second data string loading bits have been shifted into the JTAG DR.

7. A testing apparatus for loading a data string into a Joint Test Action Group (JTAG) shift register of boundary scan architecture of an integrated circuit (IC) device, the testing apparatus comprising:

a test interface that couples to a test access port of the IC device; and control circuitry configured to:

apply, via the test interface, a first sequence to a first pin of the IC device, wherein the first sequence sets the shift register to a shift state;

determine whether a value of the last bit of the data string is equal to one or zero; and in response to determining that the value of the last bit of the data string is equal to one:

apply, via the test interface, a set signal to a second pin of the IC device, wherein the set signal simultaneously sets each flip-flop of the shift register to one;

identify first data string loading bits by removing, from the data string, the last bit and any other bits in a continuous sequence of bits, including the last bit, that are each equal to one; and apply, via the test interface, a first load signal to a third pin of the IC device, wherein the first load signal sequentially loads the identified first data string loading bits into the shift register.

8. The testing apparatus of claim 7, wherein the control circuitry is further configured, in response to determining that the value of the last bit of the data string is equal to zero, to:

apply, via the test interface, a reset signal to a fourth pin of the IC device, wherein the reset signal simultaneously resets each flip-flop of the shift register to zero;

identify second data string loading bits by removing, from the data string, the last bit and any other bits in a continuous sequence of bits, including the last bit, that are each equal to zero; and apply, via the test interface, a second load signal to the third pin of the IC device, wherein the second load signal sequentially loads the identified second data string loading bits into the shift register.

9. The testing apparatus of claim 8, wherein the testing apparatus is a JTAG testing apparatus and the data string is a JTAG instruction.

10. The testing apparatus of claim 9, wherein the JTAG shift register is a JTAG instruction register (IR) and the shift state is a shift IR state.

11. The testing apparatus of claim 10, wherein the control circuitry is further configured, when applying the first load signal to the third pin, to apply, via the test interface, the first load signal until all of the identified first data string loading bits have been sequentially shifted into the JTAG IR over a number of clock cycles corresponding to the number of first data string loading bits.

12. The testing apparatus of claim 10, wherein the control circuitry is further configured, when applying the second load signal to the third pin, to apply, via the test interface, the second load signal until all of the identified second data string loading bits have been sequentially shifted into the JTAG IR over a number of clock cycles corresponding to the number of second data string loading bits.

13. The testing apparatus of claim 9, wherein the JTAG shift register is a JTAG data register (DR) and the shift state is a shift DR state.

14. The testing apparatus of claim 13, wherein the control circuitry is further configured, when applying the first load signal to the third pin, to apply, via the test interface, the first load signal until all of the identified first data string loading bits have been sequentially shifted into the JTAG DR over a number of clock cycles corresponding to the number of first data string loading bits.

15. The testing apparatus of claim 13, wherein the control circuitry is further configured, when applying the second load signal to the third pin, to apply, via the test interface, the second load signal until all of the identified second data string loading bits have been sequentially shifted into the JTAG DR over a number of clock cycles corresponding to the number of second data string loading bits.

16. The testing apparatus of claim 13, wherein the JTAG DR is one of a bypass register and a boundary scan register.

17. The testing apparatus of claim 9, wherein the first pin is a Test Mode Select (TMS) pin, the second pin is a shift register set (SRS) pin, the third pin is a Test Data-In (TDI) pin, and the fourth pin is a shift register reset (SRR) pin.

18. An enhanced Joint Test Action Group (JTAG) interface comprising:

a first pin configured to receive a Test Clock (TCK) signal;

a second pin configured to receive a Test Mode Select (TMS) signal;

a third pin configured to receive a Test Data-In (TDI) signal;

a fourth pin configured to receive shift register set (SRS) signal, wherein the SRS signal is configured to simultaneously set each flip flop of a shift register equal to one; and a fifth pin configured to receive a shift register reset (SRR) signal wherein the SRR signal is configured to simultaneously set each flip flop of a shift register equal to zero.

19. The enhanced JTAG interface of claim 18, further comprising:

a sixth pin configured to output a Test Data-Out (TDO) signal; and a seventh pin configured to receive a Test Reset (TRST) signal.

20. The enhanced JTAG interface of claim 19, wherein the JTAG interface is configured to connect a JTAG testing apparatus to boundary scan architecture of an integrated circuit (IC) device.

* * * * *